(12) United States Patent
Cheng et al.

(10) Patent No.: US 9,679,939 B1
(45) Date of Patent: Jun. 13, 2017

(54) BACKSIDE ILLUMINATED IMAGE SENSOR DEVICE

(71) Applicant: TAIWAN SEMICONDUCTOR MANUFACTURING CO., LTD., Hsinchu (TW)

(72) Inventors: Yun-Wei Cheng, Taipei (TW); Yin-Chieh Huang, Tainan (TW); Ching-Chun Wang, Tainan (TW); Chun-Hao Chou, Tainan (TW); Kuo-Cheng Lee, Tainan (TW); Hsun-Ying Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/207,727

(22) Filed: Jul. 12, 2016

(51) Int. Cl.
*H01L 21/00* (2006.01)
*H01L 27/146* (2006.01)

(52) U.S. Cl.
CPC ................. *H01L 27/1464* (2013.01)

(58) Field of Classification Search
CPC .................................. H01L 27/1464
USPC ......................................................... 257/447
See application file for complete search history.

(56) References Cited

U.S. PATENT DOCUMENTS

2012/0217605 A1* 8/2012 Kunikiyo .......... H01L 27/14603
257/443

\* cited by examiner

*Primary Examiner* — Anthony Ho
(74) *Attorney, Agent, or Firm* — McClure, Qualey & Rodack, LLP

(57) ABSTRACT

A backside illuminated (BSI) image sensor device includes a device layer, a doped isolation region and a doped radiation sensing region. The device layer has a front side and a backside, in which the device layer has a thickness greater than or equal to 4 μm. The doped isolation region having a first dopant of a first conductivity is through the device layer to define a plurality of pixel regions of the device layer, in which the doped isolation region includes a first upper region adjacent to the front side and a first lower region between the first upper region and the backside, and the first upper region has a width less than a width of the first lower region. The doped radiation sensing region having a second dopant of a second conductivity opposite to the first conductivity is in one of the pixel regions of the device layer.

20 Claims, 3 Drawing Sheets

BACKSIDE ILLUMINATED IMAGE SENSOR DEVICE

BACKGROUND

Image sensors are used to sense radiation such as light. Complementary metal-oxide-semiconductor (CMOS) image sensors (CIS) and charge-coupled device (CCD) sensors are widely used in various applications such as digital camera or mobile phone camera applications.

A typical image sensor includes various optical and electronic elements formed on a front side of the sensor. The optical elements include at least an array of individual pixels to capture light incident on the image sensor, while the electronic elements include transistors. Although the optical and electronic elements are formed on the front side, an image sensor can be operated as a frontside illuminated (FSI) image sensor or a backside illuminated (BSI) image sensor. In an FSI image sensor, light to be captured by the pixels in the pixel array is incident on the front side of the sensor, while in a BSI image sensor, the light to be captured is incident on the back side of the sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
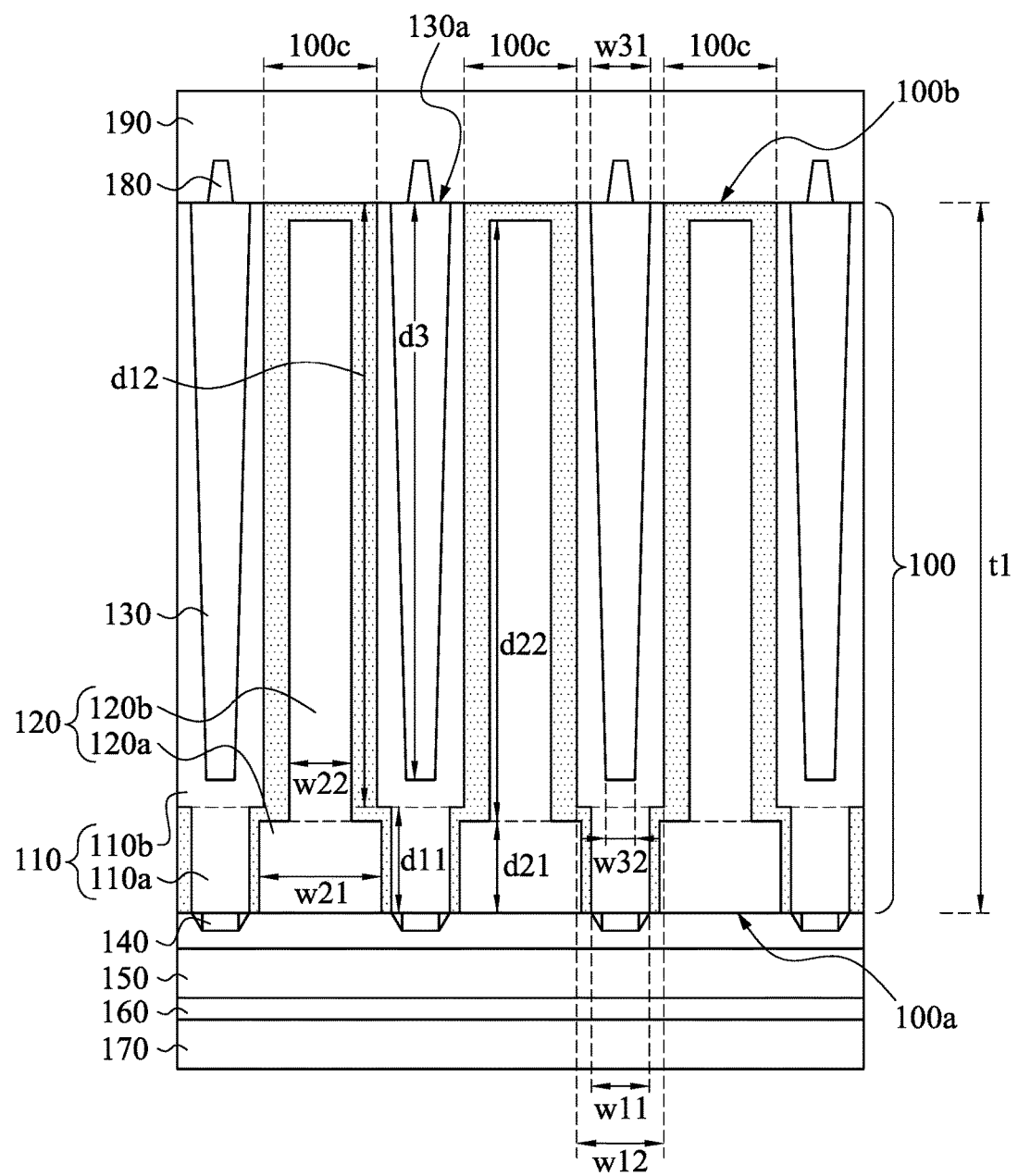
FIG. 1 is a cross-sectional view of a BSI image sensor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, although the optical and electronic elements are formed on the front side, an image sensor can be operated as a frontside illuminated (FSI) image sensor or a backside illuminated (BSI) image sensor. Compared with the FSI image sensors, the BSI image sensors have advantages of low cost, tiny size and high integration. The BSI image sensors also have advantages of low operating voltage, low power consumption and high quantum efficiency. Therefore, the BSI image sensors are adopted broadly in electronic products.

However, for some applications, such as for sensing non-visible infrared light (e.g., near infrared light), a thickness of the device layer should be increased. Therefore, the present application provides a BSI image sensor device for sensing non-visible infrared light, in which the BSI image sensor device has a device layer with a thickness greater than or equal to 4 μm and a doped isolation region with a specific shape. Embodiments of each element of the BSI image sensor device will be described below in detail.

FIG. 1 is a cross-sectional view of a BSI image sensor device 10 in accordance with some embodiments of the present disclosure. The BSI image sensor device 10 includes a device layer 100, a doped isolation region 110 in the device layer 100 and a doped radiation sensing region 120 in the device layer 100.

In some embodiments, the device layer 100 is a silicon device layer doped with a dopant, such as a p-type dopant (e.g., boron), and such device layer may be called as a p-type device layer. Alternatively, in some embodiments, the device layer 100 is a silicon device layer doped with an n-type dopant (e.g., phosphorous or arsenic), and such device layer may be called as an n-type device layer. In some embodiments, the device layer 100 includes other elementary semiconductors such as germanium and diamond. In some embodiments, the device layer 100 includes a compound semiconductor and/or an alloy semiconductor. In some embodiments, the device layer 100 includes an epitaxial layer (epi layer). In some embodiments, the device layer 100 is an epitaxial layer.

The device layer 100 has a front side (also referred to as a front surface) 100a and a back side (also referred to as a back surface) 100b opposite to the front side 100a. In some embodiments, for the BSI image sensor device 10, radiation is projected from the back surface 100b. In some embodiments, the reversed device (i.e., the BSI image sensor device) 10 is supported by a carrier substrate 170 (e.g., a carrier wafer). In some embodiments, the device layer 100 has a thickness t1 greater than or equal to 4 μm for sensing non-visible infrared light. In some embodiments, the thickness t1 is greater than or equal to 4.5 or 5 μm.

The doped isolation region 110 having a first dopant of a first conductivity is through the device layer 100 to define a plurality of pixel regions 100c of the device layer 100. In some embodiments, the first dopant of the doped isolation region 110 has the same conductivity as the dopant of the device layer 100. In some embodiments, the doped isolation region 110 includes a p-type dopant, such as boron. In some embodiments, the doped isolation region 110 is a p-type doped region. In some embodiments, the doped isolation region 110 is formed by one or more ion implantation processes and diffusion processes.

In some embodiments, the doped isolation region 110 includes a first upper region 110a adjacent to the front side 100a and a first lower region 110b between the first upper region 110a and the back side 100b. In some embodiments, the first upper region 110a is in contact with the front side 100a. In some embodiments, the first lower region 110b is in contact with the back side 100b and connected to the first upper region 110a. In some embodiments, the first upper region 110a is elongated substantially along a thickness direction of the device layer 100. In some embodiments, the first lower region 110b is elongated along the thickness direction of the device layer 100.

The first upper region 110a has a width w11 less than a width w12 of the first lower region 110b, as shown in FIG. 1. In some embodiments, a ratio of the width w11 of the first upper region 110a to the width w12 of the first lower region 110b is greater than or equal to 1:10 and less than 1:1. In some embodiments, the width w11 of the first upper region 110a is 5 to 30% based on the total thickness t1 of the device layer 100. In some embodiments, the width 12 of the first lower region 110b is 20 to 60% based on the total thickness t1 of the device layer 100.

In some embodiments, a ratio of a depth d11 of the first upper region 110a to a depth d12 of the first lower region 110b is in a range of 1:10 to 2:1. In some embodiments, the depth d11 of the first upper region 110a is greater than or equal to 10% based on the total thickness t1 of the device layer 100 and less than 100% based on the total thickness t1 of the device layer 100. In some embodiments, the depth d12 of the first lower region 110b is greater than or equal to 50% based on the total thickness t1 of the device layer 100 and less than 100% based on the total thickness t1 of the device layer 100.

The doped radiation sensing region 120 having a second dopant of a second conductivity opposite to the first conductivity is in one of the pixel regions 100c of the device layer 100. In some embodiments, as shown in FIG. 1, the doped radiation sensing regions 120 are respectively in the pixel regions 100c of the device layer 100. In some embodiments, the second dopant of the doped radiation sensing region 120 has different conductivity of the dopant of the device layer 100. In some embodiments, the doped radiation sensing region 120 includes an n-type dopant, such as phosphorous or arsenic. In some embodiments, the doped radiation sensing region 120 is an n-type doped region. In some embodiments, the doped radiation sensing region 120 is formed by one or more ion implantation processes and diffusion processes. In some embodiments, the doped isolation region 110 is separated from the doped radiation sensing region 120.

For the BSI image sensor device 10, the doped radiation sensing regions 120 respectively in the pixel regions 100c are operable to detect radiation, such as an incident light, which is projected toward the device layer 100 from the back side 100b. In some embodiments, the doped radiation sensing region 120 includes a photodiode.

In some embodiments, the doped radiation sensing region 120 includes a second upper region 120a adjacent to the front side 100a and a second lower region 120b between the second upper region 120a and the back side 100b. In some embodiments, the second upper region 120a is in contact with the front side 100a. In some embodiments, the second lower region 120b is in contact with the back side 100b and connected to the second upper region 120a. In some embodiments, the second upper region 120a is elongated substantially along the thickness direction of the device layer 100. In some embodiments, the second lower region 120b is elongated substantially along the thickness direction of the device layer 100.

In some embodiments, the second upper region 120a has a width w21 greater than or equal to a width w22 of the second lower region 120b. In some embodiments, a ratio of the width w21 of the second upper region 120a to the width w22 of the second lower region 120b is in a range of 1:1 to 10:1. In some embodiments, the width w21 of the second upper region 120a is greater than or equal to 60% based on the total thickness t1 of the device layer 100 and less than 100% based on the total thickness t1 of the device layer 100. In some embodiments, the width w22 of the second lower region 120b is 20 to 80% based on the total thickness t1 of the device layer 100.

Figure 2:
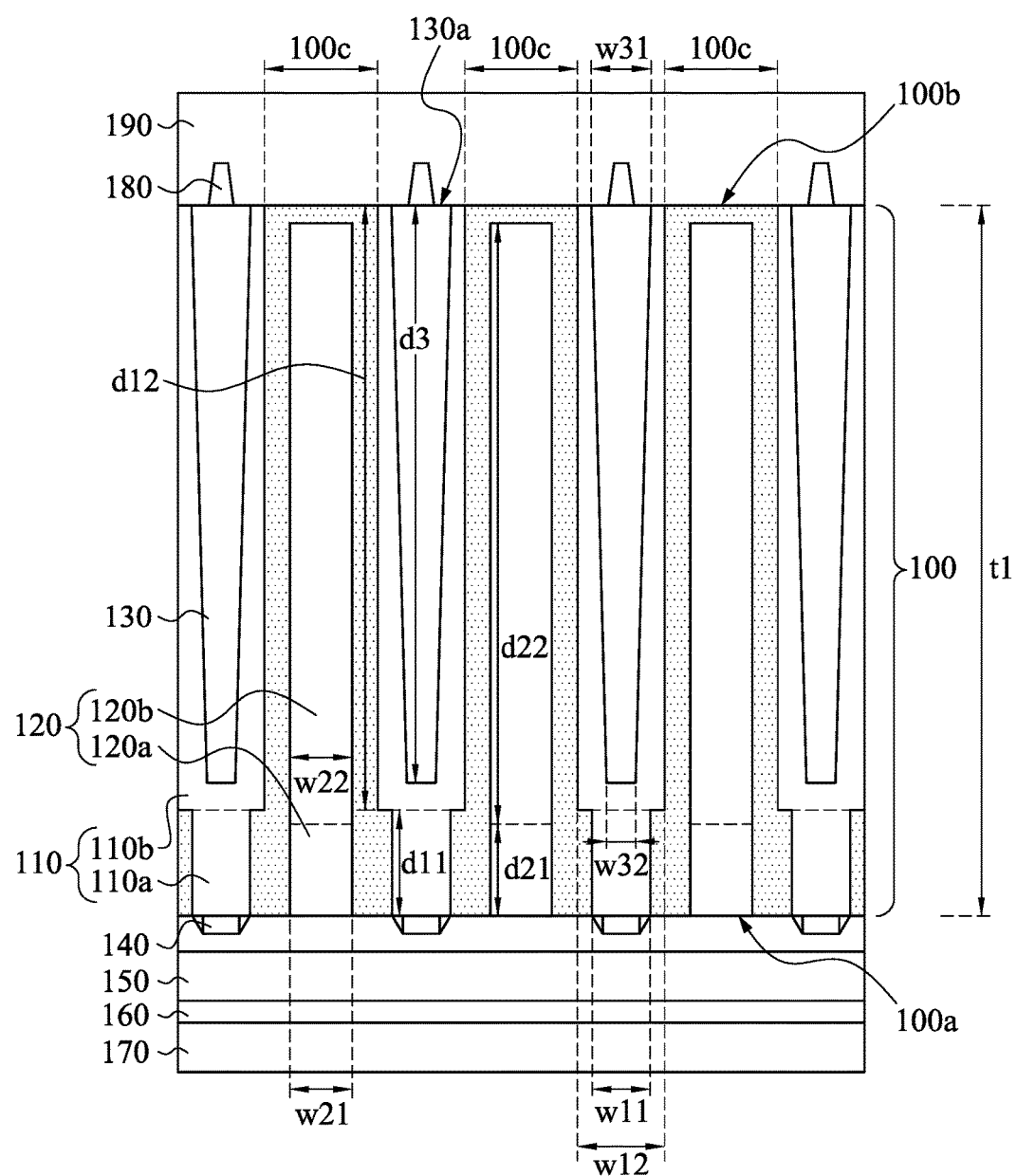
FIG. 2 is a cross-sectional view of a BSI image sensor device in accordance with some embodiments of the present disclosure.

In some embodiments, the width w21 of the second upper region 120a is greater than the width w22 of the second lower region 120b, as shown in FIG. 1. FIG. 2 is a cross-sectional view of a BSI image sensor device 20 in accordance with some embodiments of the present disclosure. In some embodiments, the width w21 of the second upper region 120a is equal to the width w22 of the second lower region 120b, as shown in FIG. 2.

In some embodiments, a ratio of a depth d21 of the second upper region 120a to a depth d22 of the second lower region 120b is in a range of 1:10 to 2:1. In some embodiments, the depth d21 of the second upper region 120a is greater than or equal to 10% based on the total thickness t1 of the device layer 100 and less than 100% based on the total thickness t1 of the device layer 100. In some embodiments, the depth d22 of the second lower region 120b is greater than or equal to 50% based on the total thickness t1 of the device layer 100 and less than 100% based on the total thickness t1 of the device layer 100.

In some embodiments, a ratio of the width w11 of the first upper region 110a to the width w21 of the second upper region 120a is in a range of 1:20 to 1:3. In some embodiments, a ratio of the width w12 of the first lower region 110b to the width w22 of the second lower region 120b is in a range of 1:10 to 10:1.

In some embodiments, a ratio of the depth d11 of the first upper region 110a to the depth d21 of the second upper region 120a is in a range of 1:3 to 3:1. In some embodiments, the depth d11 of the first upper region 110a is greater than the depth d21 of the second upper region 120a, as shown in FIG. 1. In some embodiments, a ratio of the depth d12 of the first lower region 110b to the depth d22 of the second lower region 120b is in a range of 1:3 to 3:1.

In some embodiments, the BSI image sensor device 10 further includes a deep trench isolation (DTI) structure 130 in the doped isolation region 110. In some embodiments, the deep trench isolation structure 130 is in the first lower region 110b of the doped isolation region 110. In some embodiments, the deep trench isolation structure has a depth d3 greater than or equal to 2 µm. In some embodiments, the depth d3 of the deep trench isolation structure 130 is more than half the thickness t1 of the device layer 100. In some embodiments, the deep trench isolation structure 130 has a surface 130a coplanar with the back side 100b. In some embodiments, the deep trench isolation structure 130 has two ends opposite to each other, and one end (not marked) of the deep trench isolation structure 130 adjacent to the back side 110b has a width w31 greater than a width w32 of the other end (not marked) of the deep trench isolation structure 130 adjacent to the front side 100a. In some embodiments, the deep trench isolation structure 130 has a width w31 or w32 less than a width w12 of the first lower region of the doped isolation region. In some embodiments, the BSI image sensor device 10 further includes a metal grid 180 in contact with the deep trench isolation structure 130.

In some embodiments, the BSI image sensor device 10 further includes a passivation layer 190 covering the metal grid 180. In some embodiments, the passivation layer 190 includes a dielectric material such as silcon oxide. In some embodiments, the passivation layer 190 includes silicon nitride. In some embodiments, passivation layer 190 is formed by chemical vapor deposition (CVD), physical vapor deposition (PVD) or other suitable processes.

In some embodiments, the BSI image sensor device 10 further includes a transistor 140 in contact with the front side 100*a* of the device layer 100. In some embodiments, the transistor 140 is in contact with the first upper region 110*a*. In some embodiments, the transistor 140 is a MOS transistor.

In some embodiments, the BSI image sensor device 10 further includes an interconnect structure 150 covering the transistor 140. In some embodiments, the interconnect structure 150 includes a plurality of patterned dielectric layers (not shown) and conductive layers (not shown) that provide interconnections (e.g., wiring). In some embodiments, the interconnect structure 150 includes an interlayer dielectric (ILD) (not shown) and a multilayer interconnect (MLI) structure (not shown). In some embodiments, the MLI structure includes contacts, vias and metal lines.

In some embodiments, the BSI image sensor device 10 further includes a passivation layer 160 covering the interconnect structure 150. In some embodiments, the passivation layer 160 includes a dielectric material such as silcon oxide. In some embodiments, the passivation layer 160 includes silicon nitride. In some embodiments, passivation layer 160 is formed by chemical vapor deposition (CVD), physical vapor deposition (PVD) or other suitable processes.

In some embodiments, the carrier substrate 170 covers the passivation layer 160. In some embodiments, the carrier substrate 170 includes a silicon material. In some embodiments, the carrier substrate 170 includes a glass substrate or another suitable material.

The present application further provides a BSI image sensor device for sensing non-visible infrared light, in which the BSI image sensor device has a device layer with a thickness greater than or equal to 4 µm and a doped radiation sensing region with a specific shape. Embodiments of each element of the BSI image sensor device will be described below in detail.

Figure 3:
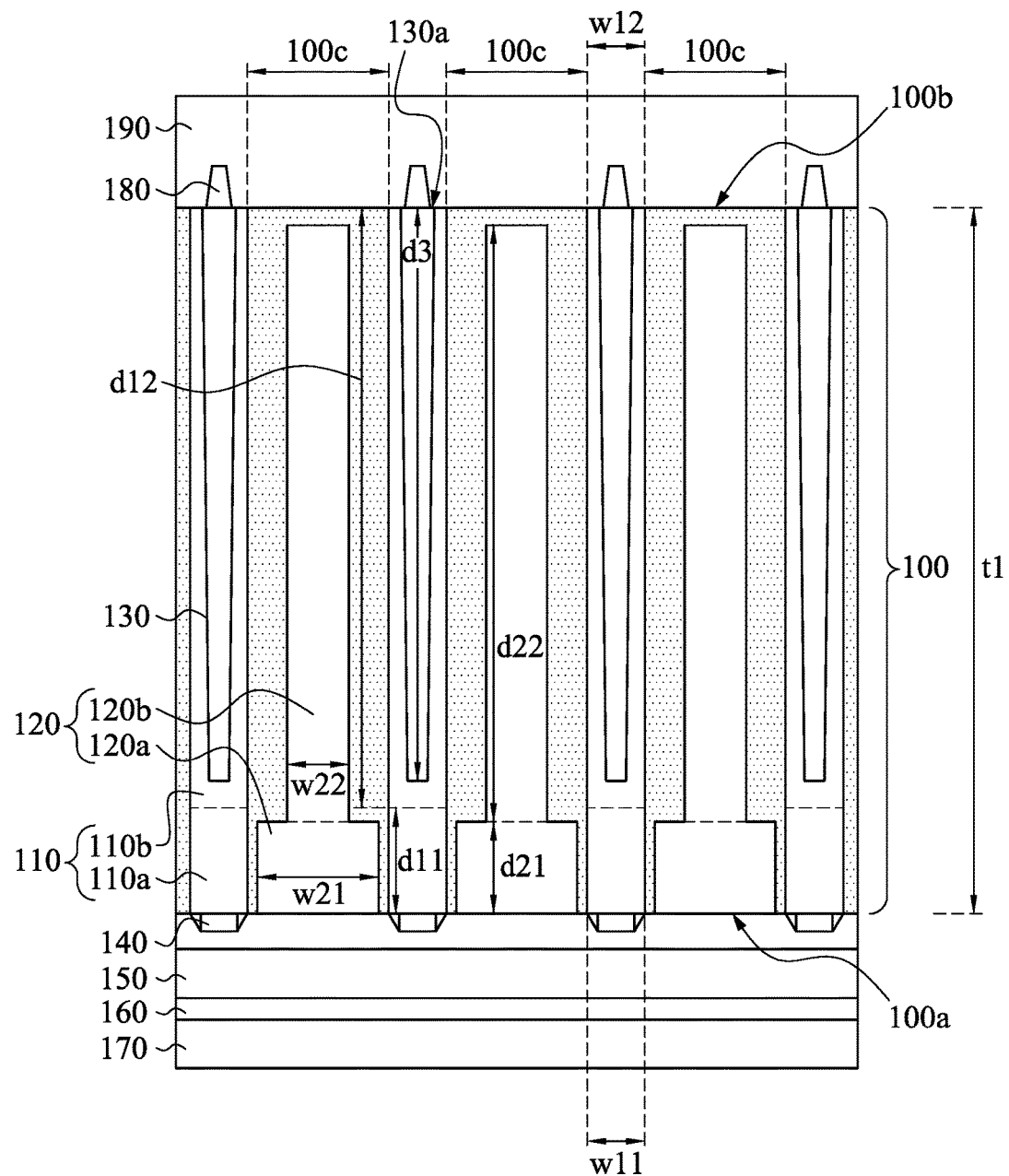
FIG. 3 is a cross-sectional view of a BSI image sensor device in accordance with some embodiments of the present disclosure.

FIG. 3 is a cross-sectional view of a BSI image sensor device 30 in accordance with some embodiments of the present disclosure. The BSI image sensor device 30 includes a device layer 100, a doped isolation region 110 in the device layer 100 and a doped radiation sensing region 120 in the device layer 100.

In some embodiments, the device layer 100 is a silicon device layer doped with a dopant, such as a p-type dopant (e.g., boron), and such device layer may be called as a p-type device layer. Alternatively, in some embodiments, the device layer 100 is a silicon device layer doped with an n-type dopant (e.g., phosphorous or arsenic), and such device layer may be called as an n-type device layer. In some embodiments, the device layer 100 includes other elementary semiconductors such as germanium and diamond. In some embodiments, the device layer 100 includes a compound semiconductor and/or an alloy semiconductor. In some embodiments, the device layer 100 includes an epitaxial layer (epi layer). In some embodiments, the device layer 100 is an epitaxial layer.

The device layer 100 has a front side (also referred to as a front surface) 100*a* and a back side (also referred to as a back surface) 100*b* opposite to the front side 100*a*. In some embodiments, for the BSI image sensor device 30, radiation is projected from the back surface 100*b*. In some embodiments, the reversed device (i.e., the BSI image sensor device) 30 is supported by a carrier substrate 170 (e.g., a carrier wafer). In some embodiments, the device layer 100 has a thickness t1 greater than or equal to 4 µm for sensing non-visible infrared light. In some embodiments, the thickness t1 is greater than or equal to 4.5 or 5 µm.

The doped isolation region 110 having a first dopant of a first conductivity is through the device layer 100 to define a plurality of pixel regions 100*c* of the device layer 100. In some embodiments, the first dopant of the doped isolation region 110 has the same conductivity as the dopant of the device layer 100. In some embodiments, the doped isolation region 110 includes a p-type dopant, such as boron. In some embodiments, the doped isolation region 110 is a p-type doped region. In some embodiments, the doped isolation region 110 is formed by one or more ion implantation processes and diffusion processes.

The doped radiation sensing region 120 having a second dopant of a second conductivity opposite to the first conductivity is in one of the pixel regions 100*c* of the device layer 100. In some embodiments, the second dopant of the doped radiation sensing region 120 has different conductivity of the dopant of the device layer 100. In some embodiments, the doped radiation sensing region 120 includes an n-type dopant, such as phosphorous or arsenic. In some embodiments, the doped radiation sensing region 120 is an n-type doped region. In some embodiments, the doped radiation sensing region 120 is formed by one or more ion implantation processes and diffusion processes. In some embodiments, the doped isolation region 110 is separated from the doped radiation sensing region 120.

For the BSI image sensor device 30, the doped radiation sensing regions 120 respectively in the pixel regions 100*c* are operable to detect radiation, such as an incident light, which is projected toward the device layer 100 from the back side 100*b*. In some embodiments, the doped radiation sensing region 120 includes a photodiode.

The doped radiation sensing region 120 includes a second upper region 120*a* adjacent to the front side 100*a* and a second lower region 120*b* between the second upper region 120*a* and the back side 100*b*. In some embodiments, the second upper region 120*a* is in contact with the front side 100*a*. In some embodiments, the second lower region 120*b* is in contact with the back side 100*b* and connected to the second upper region 120*a*. In some embodiments, the second upper region 120*a* is elongated substantially along a thickness direction of the device layer 100. In some embodiments, the second lower region 120*b* is elongated substantially along the thickness direction of the device layer 100.

The second upper region 120*a* has a width w21 greater than width w22 of the second lower region 120*b*, as shown in FIG. 3. In some embodiments, a ratio of the width w21 of the second upper region 120*a* to the width w22 of the second lower region 120*b* is greater than 1:1 and less than or equal to 10:1. In some embodiments, the width w21 of the second upper region 120*a* is greater than or equal to 60% based on the total thickness t1 of the device layer 100 and less than 100% based on the total thickness t1 of the device layer 100. In some embodiments, the width w22 of the second lower region 120*b* is 20 to 80% based on the total thickness t1 of the device layer 100.

In some embodiments, a ratio of a depth d21 of the second upper region 120a to a depth d22 of the second lower region 120b is in a range of 1:10 to 2:1. In some embodiments, the depth d21 of the second upper region 120a is greater than or equal to 10% based on the total thickness t1 of the device layer 100 and less than 100% based on the total thickness t1 of the device layer 100. In some embodiments, the depth d22 of the second lower region 120b is greater than or equal to 50% based on the total thickness t1 of the device layer 100 and less than 100% based on the total thickness t1 of the device layer 100.

In some embodiments, the doped isolation region 110 includes a first upper region 110a adjacent to the front side 100a and a first lower region 110b between the first upper region 110a and the back side 100b. In some embodiments, the first upper region 110a is in contact with the front side 100a. In some embodiments, the first lower region 110b is in contact with the back side 100b and connected to the first upper region 110a. In some embodiments, the first upper region 110a is elongated substantially along the thickness direction of the device layer 100. In some embodiments, the first lower region 110b is elongated along the thickness direction of the device layer 100.

In some embodiments, the first upper region 110a has a width w11 less than or equal to a width w12 of the first lower region 110b. In some embodiments, the width w11 is equal to the width 12, as shown in FIG. 3. In some embodiments, the width w11 is less than the width w12, as shown in FIG. 1 or 2. In some embodiments, a ratio of the width w11 of the first upper region 110a to the width w12 of the first lower region 110b is in a range of 1:10 to 1:1. In some embodiments, the width w11 of the first upper region 110a is 5 to 30% based on the total thickness t1 of the device layer 100. In some embodiments, the width 12 of the first lower region 110b is 20 to 60% based on the total thickness t1 of the device layer 100.

In some embodiments, the BSI image sensor device 30 further includes a deep trench isolation (DTI) structure 130 in the doped isolation region 110. In some embodiments, the deep trench isolation structure has a depth d3 greater than or equal to 2 µm. In some embodiments, the depth d3 of the deep trench isolation structure 130 is more than half the thickness t1 of the device layer 100. In some embodiments, the deep trench isolation structure 130 has a surface 130a coplanar with the back side 100b.

The present application further provides a BSI image sensor device for sensing non-visible infrared light, in which the BSI image sensor device has a device layer with a thickness greater than or equal to 4 µm and a deep trench isolation structure with a depth greater than or equal to 2 µm.

As shown in FIG. 1, the BSI image sensor device 10 includes a device layer 100, a doped isolation region 110, a deep trench isolation structure 130 and a doped radiation sensing region 120. The device layer 100 has a front side 100a and a back side 100b, in which the device layer 100 has a thickness t1 greater than or equal to 4 µm. The doped isolation region 110 having a first dopant of a first conductivity is through the device layer 100 to define a plurality of pixel regions 100c of the device layer 100. The deep trench isolation structure 130 is in the doped isolation region 110, in which the deep trench isolation structure 130 has a depth d3 greater than or equal to 2 µm. The doped radiation sensing region 120 having a second dopant of a second conductivity opposite to the first conductivity is in one of the pixel regions 100c of the device layer 100.

In some embodiments, the doped isolation region 110 includes a first upper region 110a adjacent to the front side 100a and a first lower region 110b between the first upper region 110a and the back side 100b, and the first upper region 110a has a width w11 less than a width w12 of the first lower region 110b, and the doped radiation sensing region 120 includes a second upper region 120a adjacent to the front side 100a and a second lower region 120b between the second upper region 120a and the back side 100b, and the second upper region 120a has a width w21 greater than a width w22 of the second lower region 120b. In some embodiments, the deep trench isolation structure 130 is in the first lower region 110b of the doped isolation region 110.

According to some embodiments, a BSI image sensor device includes a device layer, a doped isolation region and a doped radiation sensing region. The device layer has a front side and a back side, in which the device layer has a thickness greater than or equal to 4 µm. The doped isolation region having a first dopant of a first conductivity is through the device layer to define a plurality of pixel regions of the device layer, in which the doped isolation region includes a first upper region adjacent to the front side and a first lower region between the first upper region and the back side, and the first upper region has a width less than a width of the first lower region. The doped radiation sensing region having a second dopant of a second conductivity opposite to the first conductivity is in one of the pixel regions of the device layer.

According to some embodiments, a BSI image sensor device includes a device layer, a doped isolation region and a doped radiation sensing region. The device layer has a front side and a back side, in which the device layer has a thickness greater than or equal to 4 µm. The doped isolation region having a first dopant of a first conductivity is through the device layer to define a plurality of pixel regions of the device layer. The doped radiation sensing region having a second dopant of a second conductivity opposite to the first conductivity is in one of the pixel regions of the device layer, in which the doped radiation sensing region includes a second upper region adjacent to the front side and a second lower region between the second upper region and the back side, and the second upper region has a width greater than a width of the second lower region.

According to some embodiments, a BSI image sensor device includes a device layer, a doped isolation region, a deep trench isolation structure and a doped radiation sensing region. The device layer has a front side and a back side, in which the device layer has a thickness greater than or equal to 4 µm. The doped isolation region having a first dopant of a first conductivity is through the device layer to define a plurality of pixel regions of the device layer. The deep trench isolation structure is in the doped isolation region, in which the deep trench isolation structure has a depth greater than or equal to 2 µm. The doped radiation sensing region having a second dopant of a second conductivity opposite to the first conductivity is in one of the pixel regions of the device layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A backside illuminated (BSI) image sensor device, comprising:
   a device layer having a front side and a back side, wherein the device layer has a thickness greater than or equal to 4 µm;
   a doped isolation region having a first dopant of a first conductivity through the device layer to define a plurality of pixel regions of the device layer, wherein the doped isolation region comprises a first upper region adjacent to the front side and a first lower region between the first upper region and the back side, and the first upper region has a width less than a width of the first lower region; and
   a doped radiation sensing region having a second dopant of a second conductivity opposite to the first conductivity in one of the pixel regions of the device layer.

2. The BSI image sensor device of claim 1, further comprising a deep trench isolation structure in the doped isolation region.

3. The BSI image sensor device of claim 2, wherein the deep trench isolation structure is in the first lower region of the doped isolation region.

4. The BSI image sensor device of claim 3, wherein the deep trench isolation structure has a width less than a width of the first lower region of the doped isolation region.

5. The BSI image sensor device of claim 2, wherein the deep trench isolation structure has a depth greater than or equal to 2 µm.

6. The BSI image sensor device of claim 2, wherein the deep trench isolation structure has a surface coplanar with the back side.

7. The BSI image sensor device of claim 2, further comprising a metal grid in contact with the deep trench isolation structure.

8. The BSI image sensor device of claim 2, wherein the deep trench isolation structure has two ends opposite to each other, and one end of the deep trench isolation structure adjacent to the back side has a width greater than a width of the other end of the deep trench isolation structure adjacent to the front side.

9. The BSI image sensor device of claim 1, wherein the doped isolation region is separated from the doped radiation sensing region.

10. The BSI image sensor device of claim 1, wherein a ratio of the width of the first upper region to the width of the first lower region is greater than or equal to 1:10.

11. The BSI image sensor device of claim 1, wherein a ratio of a depth of the first upper region to a depth of the first lower region is in a range of 1:10 to 2:1.

12. The BSI image sensor device of claim 1, further comprising a transistor in contact with the first upper region.

13. The BSI image sensor device of claim 1, wherein the doped radiation sensing region comprises a second upper region adjacent to the front side and a second lower region between the second upper region and the back side, and the second upper region has a width greater than a width of the second lower region.

14. The BSI image sensor device of claim 13, wherein the first upper region has a depth greater than a depth of the second upper region.

15. The BSI image sensor device of claim 13, wherein a distance between the first upper region and the second upper region is less than a distance between the first lower region and the second lower region.

16. A BSI image sensor device, comprising:
   a device layer having a front side and a back side, wherein the device layer has a thickness greater than or equal to 4 µm;
   a doped isolation region having a first dopant of a first conductivity through the device layer to define a plurality of pixel regions of the device layer; and
   a doped radiation sensing region having a second dopant of a second conductivity opposite to the first conductivity in one of the pixel regions of the device layer, wherein the doped radiation sensing region comprises a second upper region adjacent to the front side and a second lower region between the second upper region and the back side, and the second upper region has a width greater than a width of the second lower region.

17. The BSI image sensor device of claim 16, further comprising a deep trench isolation structure in the doped isolation region.

18. A BSI image sensor device, comprising:
   a device layer having a front side and a back side, wherein the device layer has a thickness greater than or equal to 4 µm;
   a doped isolation region having a first dopant of a first conductivity through the device layer to define a plurality of pixel regions of the device layer;
   a deep trench isolation structure in the doped isolation region, wherein the deep trench isolation structure has a depth greater than or equal to 2 µm; and
   a doped radiation sensing region having a second dopant of a second conductivity opposite to the first conductivity in one of the pixel regions of the device layer.

19. The BSI image sensor device of claim 18, wherein the doped isolation region comprises a first upper region adjacent to the front side and a first lower region between the first upper region and the back side, and the first upper region has a width less than a width of the first lower region, and the doped radiation sensing region comprises a second upper region adjacent to the front side and a second lower region between the second upper region and the back side, and the second upper region has a width greater than a width of the second lower region.

20. The BSI image sensor device of claim 19, wherein the deep trench isolation structure is in the first lower region of the doped isolation region.

* * * * *